US005327451A

United States Patent [19]
Walker et al.

[11] Patent Number: 5,327,451
[45] Date of Patent: Jul. 5, 1994

[54] LASER DIODE ASSEMBLY FOR LASER SCANNER SYSTEM

[75] Inventors: Ray A. Walker, Eugene; Jeffrey A. Gohman, Hillsboro, both of Oreg.; Michael A. Lind, Kent, Wash.; Peter G. Howard, Junction City, Oreg.; William E. Ortyn, Duvall, Wash.; Michael R. Greenberg, Chico, Calif.

[73] Assignee: Spectra-Physics Scanning Systems, Inc., Eugene, Oreg.

[21] Appl. No.: 927,129

[22] Filed: Aug. 7, 1992

[51] Int. Cl.⁵ ............................................. H01S 3/08
[52] U.S. Cl. ....................................... 372/98; 372/38; 372/101
[58] Field of Search ........................... 372/98, 101, 38

[56] References Cited

U.S. PATENT DOCUMENTS

| | | |
|---|---|---|
| 3,982,201 | 9/1976 | Rosenkrantz et al. |
| 4,786,798 | 11/1988 | Lonsdale |
| 4,794,240 | 12/1988 | Schou et al. |
| 4,861,973 | 8/1989 | Hellekson et al. |
| 5,271,025 | 12/1993 | Rand ...................................... 372/42 |

OTHER PUBLICATIONS

Buzawa, M. John, "Lens System for Laser Scanners," *Laser Focus*, Sep. 1980, pp. 82–85.
Kuntz, David, "Specifying Laser Diode Optics," *Laser Focus/Electro-Optics*, Mar. 1984, pp. 44–54.

Primary Examiner—Georgia Y. Epps
Assistant Examiner—Robert E. Wise
Attorney, Agent, or Firm—Killworth, Gottman, Hagan & Schaeff

[57] ABSTRACT

A laser source arrangement is provided for use in a laser instrument of a kind used to transmit a scan pattern to a target which is spaced from the laser instrument and to detect light reflected from the target. The laser source arrangement preferably comprises a laser diode for producing a laser beam used to form the scan pattern. The laser diode is characterized by astigmatism which is subject to variation with the temperature of the case of the diode. The arrangement further includes drive apparatus for driving the laser diode in a pulsed mode having a duty cycle which reduces the astigmatism and substantially controls the temperature dependence of the astigmatism. Optics are also provided for statically correcting the astigmatism of the laser diode.

36 Claims, 15 Drawing Sheets

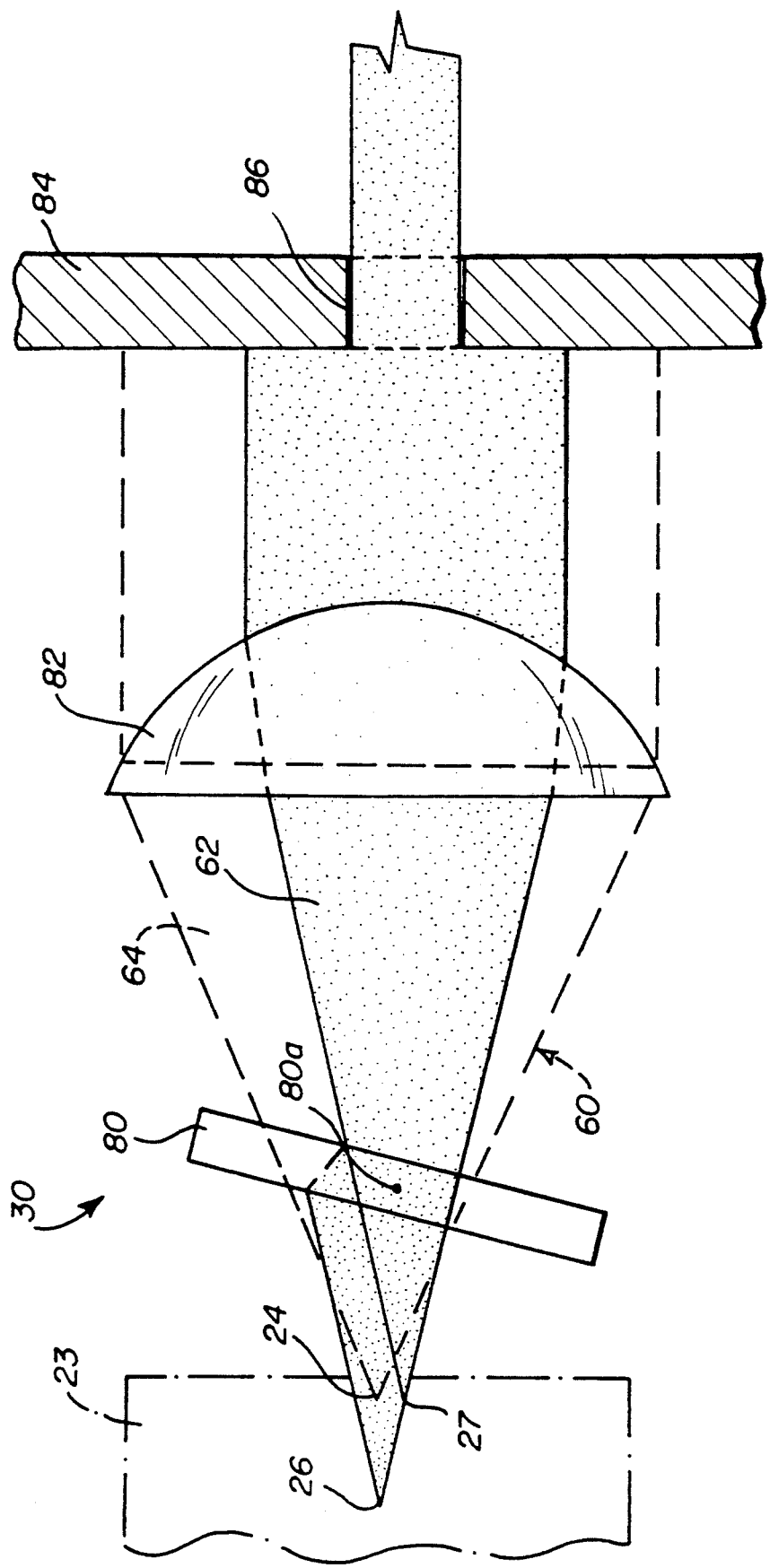

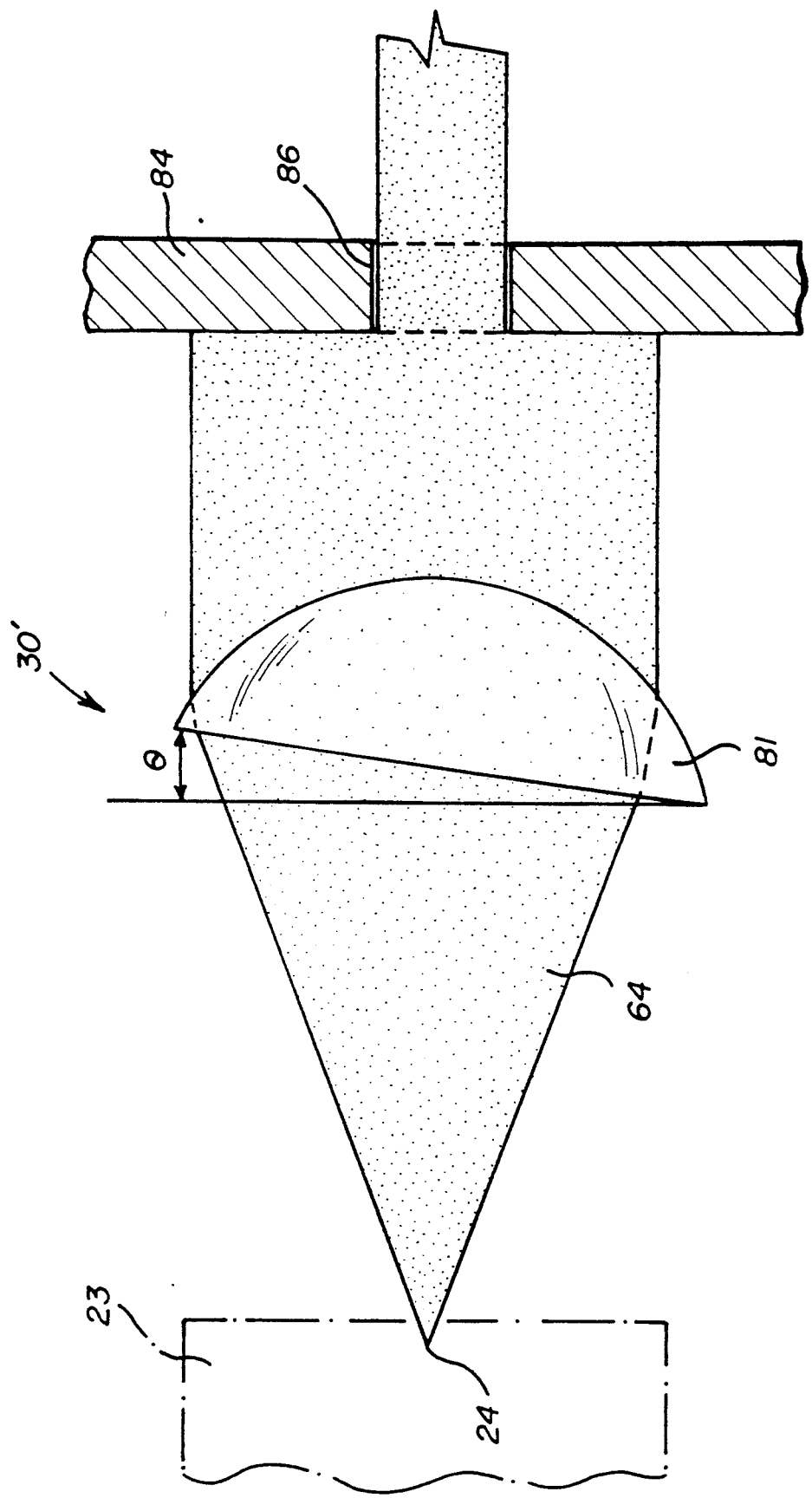

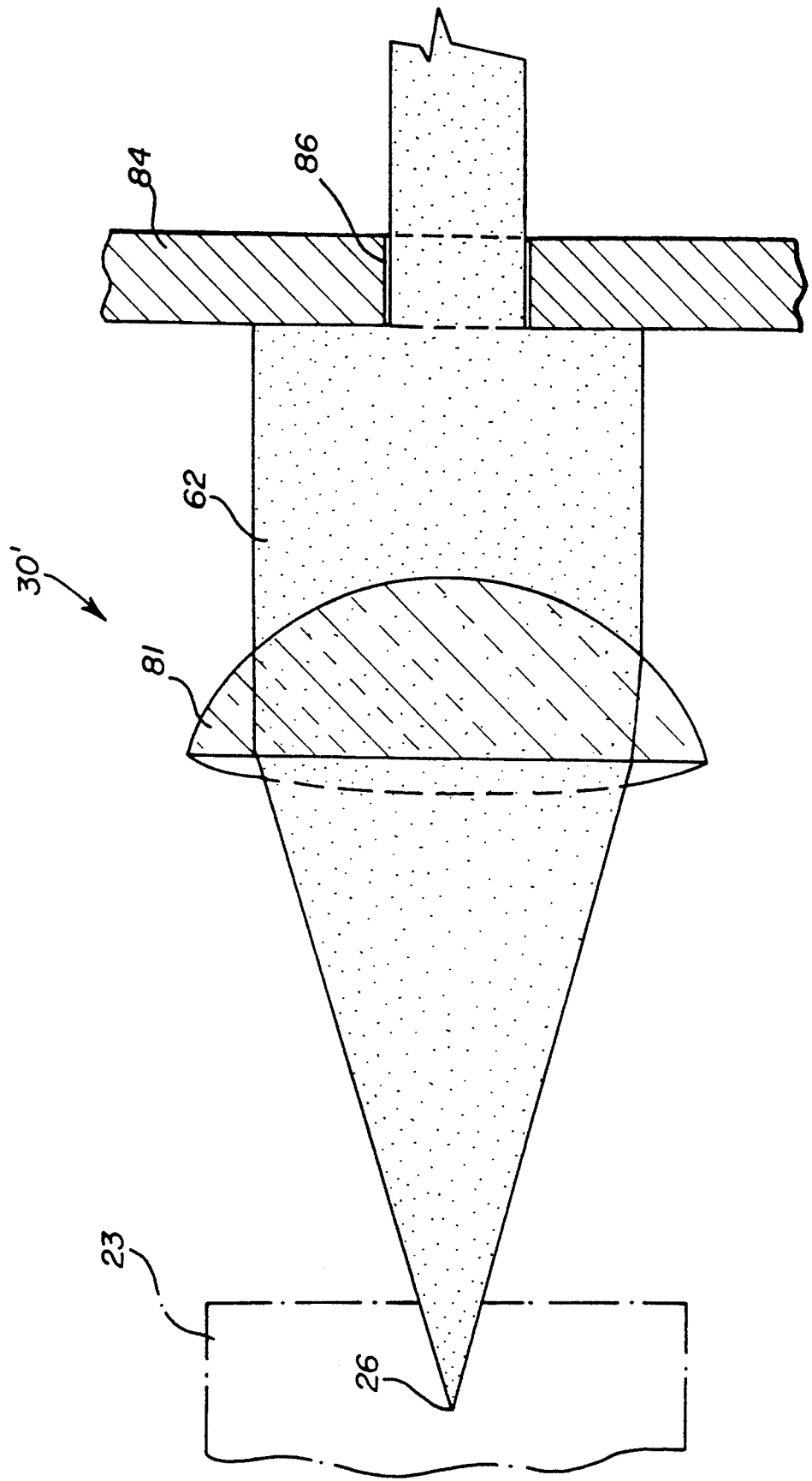

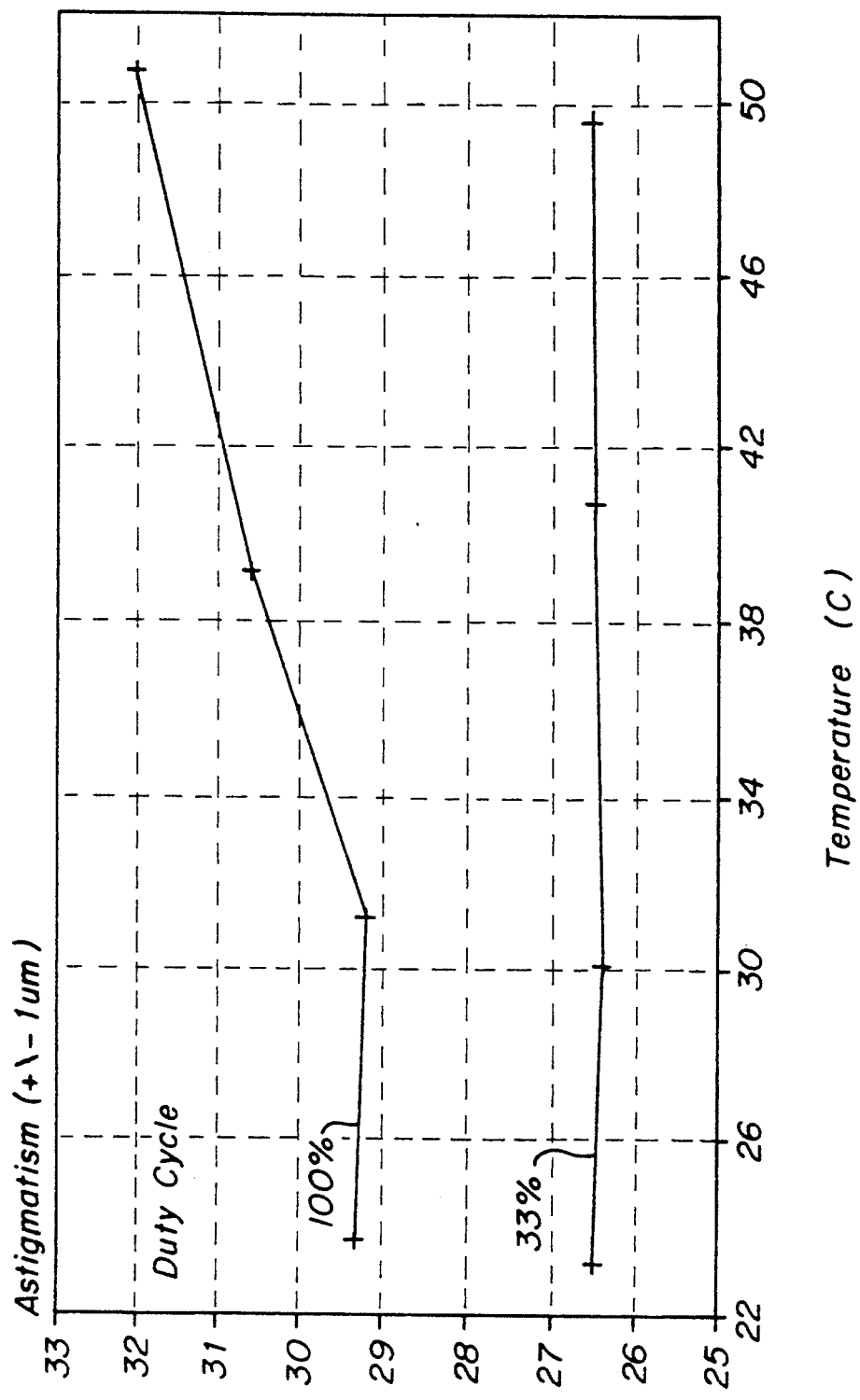

LASER DIODE ASSEMBLY FOR LASER SCANNER SYSTEM

BACKGROUND OF THE INVENTION

The present invention relates generally to a scanner for generating a scan pattern to find and read a bar code which is spaced from the scanner, such as a package label carrying a bar code symbol and, more particularly, to such a system which includes a laser diode driven in a pulsed mode for generating a laser light beam which is swept to form a scan pattern.

Laser scanners are known wherein beams of laser light are swept in scan patterns to find and read bar codes printed on surfaces which are presented to the scanners. Bar code labels are commonly used on a broad range of retail packages for check-out and inventory purposes. A scanner, located for example at the check-out station in a retail establishment, is used by a clerk to read and enter such bar coded product identification data into an associated computer system.

An example of a prior art scanner of this type is disclosed in U.S. Pat. No. 4,861,973, and includes a low power He-Ne laser tube which produces a laser beam. The beam passes through a lens assembly and is swept across the package surface by a sweeping system including a motor-driven, rotating mirror assembly and a plurality of stationarily-disposed secondary mirrors. A portion of the light reflected from the package surface returns back along the same path through the sweeping system and the lens assembly to a detector which provides an electrical signal in dependence upon the level of the reflected light. A signal processing system analyzes the electrical signal to generate data which is transmitted to a host computer. From this data the host computer determines the price of the product being purchased and keeps a running tabulation of purchased products for inventory control and accounting purposes.

In the past, gas laser tubes have primarily been used in laser scanners as a source for producing low power laser beams needed to create scan patterns, as illustrated in noted U.S. Pat. No. 4,861,973. Gas laser tubes, however, are less than ideal because of their large size, high power consumption, and cost.

An alternative source for generating low power laser beams are laser diodes. However, these devices are characterized by astigmatism which, if left uncorrected, can substantially reduce the ability of a laser scanner to properly read a bar code. Astigmatism results because wavefronts emitted from these devices have different radii of curvature in their perpendicular and parallel directions, i.e., the directions which are perpendicular and parallel to the facet stripes of the laser diodes. As a result of astigmatism, collimating or conditioning optics receive or "see" two different apparent sources at different depths within a diode.

It is also known that with laser diodes, the astigmatism, i.e., the distance between the two apparent sources, may change with the temperature of the diodes. Consequently, correction of astigmatism for one temperature does not ensure correction at all temperatures unless the temperature dependency is controlled.

Because temperature dependent astigmatism is difficult to correct, and if left uncorrected, reduces the ability of a scanner to properly read a bar code, laser diodes have not been widely used in laser scanner systems. Accordingly, there is a need for a method and apparatus capable of controlling and/or eliminating temperature dependent astigmatism associated with laser diodes. Furthermore, optics are needed for statically correcting astigmatism associated with laser diodes.

SUMMARY OF THE INVENTION

This need is met by the method and apparatus of the present invention, wherein laser diodes are driven in a pulsed mode having a duty cycle which reduces and controls temperature dependent astigmatism associated with the laser diodes. The present invention further provides optics for statically correcting astigmatism of the laser diodes.

In accordance with a first aspect of the present invention, a laser source assembly is provided for use in a laser instrument of a kind used to direct laser light to a target which is spaced from the laser instrument and to detect the laser light reflected from the target. The assembly includes light source means characterized by astigmatism for producing a laser beam. The assembly further includes means for driving the light source means in a pulsed mode having a duty cycle which reduces and controls the astigmatism associated with the light source means. The driving means is preferably operated in a pulsed mode at a duty cycle of less than 50%.

In accordance with a second aspect of the present invention, a laser source arrangement is provided for use in a laser instrument of a kind used to transmit a scan pattern to a target which is spaced from the laser instrument and to detect laser light reflected from the target. The laser source arrangement comprises a laser diode which produces a laser beam having a perpendicular divergence and a parallel divergence. The laser diode is characterized by astigmatism which is subject to variation with the case temperature of the diode. The arrangement further includes means for driving the laser diode in a pulsed mode having a duty cycle which reduces the astigmatism and substantially controls the temperature dependence of the astigmatism. Additionally provided is optics means for correcting the astigmatism and conditioning the beam so that the beam may be employed by the laser instrument to produce the scan pattern.

In a first embodiment of the present invention, the optics means comprises a tilt plate positioned adjacent to the laser diode for correcting the astigmatism and a collimating lens for conditioning the beam so that the beam may be employed by the laser instrument to produce the scan pattern. A cylindrical lens, or like element, may be substituted for the tilt plate.

In a second embodiment of the present invention, the optics means comprises a tilted lens which serves to statically correct the astigmatism and focus the beam so that the beam may be employed by the laser instrument to produce the scan pattern.

The tilted lens, while acting to substantially reduce astigmatism, also induces coma into the beam. Preferably, the laser source arrangement further includes means for correcting the coma, which means may comprise an apertured plate. Coma may also be corrected for a doublet lens, and to some extent for a singlet lens, by optimizing the shape factor of the lens.

Preferably, the first embodiment also includes an apertured plate. Comparatively, a tilt plate induces much less coma than an uncorrected tilted lens. If coma induced by a tilt plate is corrected by aperturing, then loss of an unacceptable percentage of the light beam may occur. Consequently, the apertured plate in the first embodiment of the present invention serves mainly to define and control the cross-sectional shape of the beam after receiving it from the collimating lens rather than correct for coma.

In accordance with a third aspect of the present invention, a method is provided for reducing and controlling temperature dependent astigmatism associated with a laser diode. The laser diode may be employed in a laser instrument of a kind used to direct laser light to a target which is spaced from the laser instrument and to detect laser light reflected from the target. The method comprises the step of driving the laser diode in a pulsed mode having a duty cycle which reduces the astigmatism and substantially controls the temperature dependence of the astigmatism. The laser diode is preferably driven in a pulsed mode at a duty cycle of less than 50%.

In accordance with a fourth aspect of the present invention, a laser source arrangement is provided for use in a laser instrument of a kind used to transmit a scan pattern to a target which is spaced from the laser instrument and to detect light reflected from the target. The laser source arrangement comprises a laser source which is characterized by astigmatism for producing a laser beam. Tilted lens means is further provided for correcting the astigmatism and for conditioning the beam so that the beam may be employed by the laser instrument to produce the scan pattern. The tilted lens means may comprise a tilted plano-convex lens, a multi-element lens, or the like.

In accordance with a fifth aspect of the present invention, a laser source arrangement is provided for use in a laser instrument of a kind used to direct laser light to a target which is spaced from the laser instrument and to detect light reflected from the target. The laser source arrangement comprises means for producing a laser beam, and tilted lens means for inducing a desired amount of astigmatism in the laser beam. The tilted lens means may comprise a tilted plano-convex lens, a multi-element tilted lens, or the like. The laser beam producing means may comprise a gas laser tube, or a laser diode.

Accordingly, it is an object of the present invention to provide a method and apparatus for controlling and/or eliminating the temperature dependence of astigmatism associated with laser diodes. It is a further object of the present invention to provide optics for statically correcting astigmatism associated with laser diodes. It is another object of the present invention to provide a tilted lens for producing a desired amount of astigmatism in a laser beam. It is yet another object of the present invention to provide an apertured plate or the like for correcting coma induced into a beam by optics means. These and other objects and advantages of the present invention will be apparent from the following description, the accompanying drawings and the appended claims.

BRIEF DESCRIPTION OF THE DRAWINGS

FIG. 4 is a top plan view of the laser source arrangement of FIG. 1 with the perpendicular divergence of the beam rotated 90° and superimposed over the parallel divergence of the beam;

FIG. 5b is a side view of a laser source arrangement including optics means according to the second embodiment of the present invention and showing only the perpendicular divergence of the beam, i.e., only a single vertical plane of the beam;

FIG. 6a shows the laser source arrangement illustrated in FIG. 5a with the tilted lens shown in section;

FIG. 12 is an astigmatism vs. temperature graph, illustrating test results for the laser diode employed in Example 2.

DETAILED DESCRIPTION OF THE INVENTION

Figure 1:
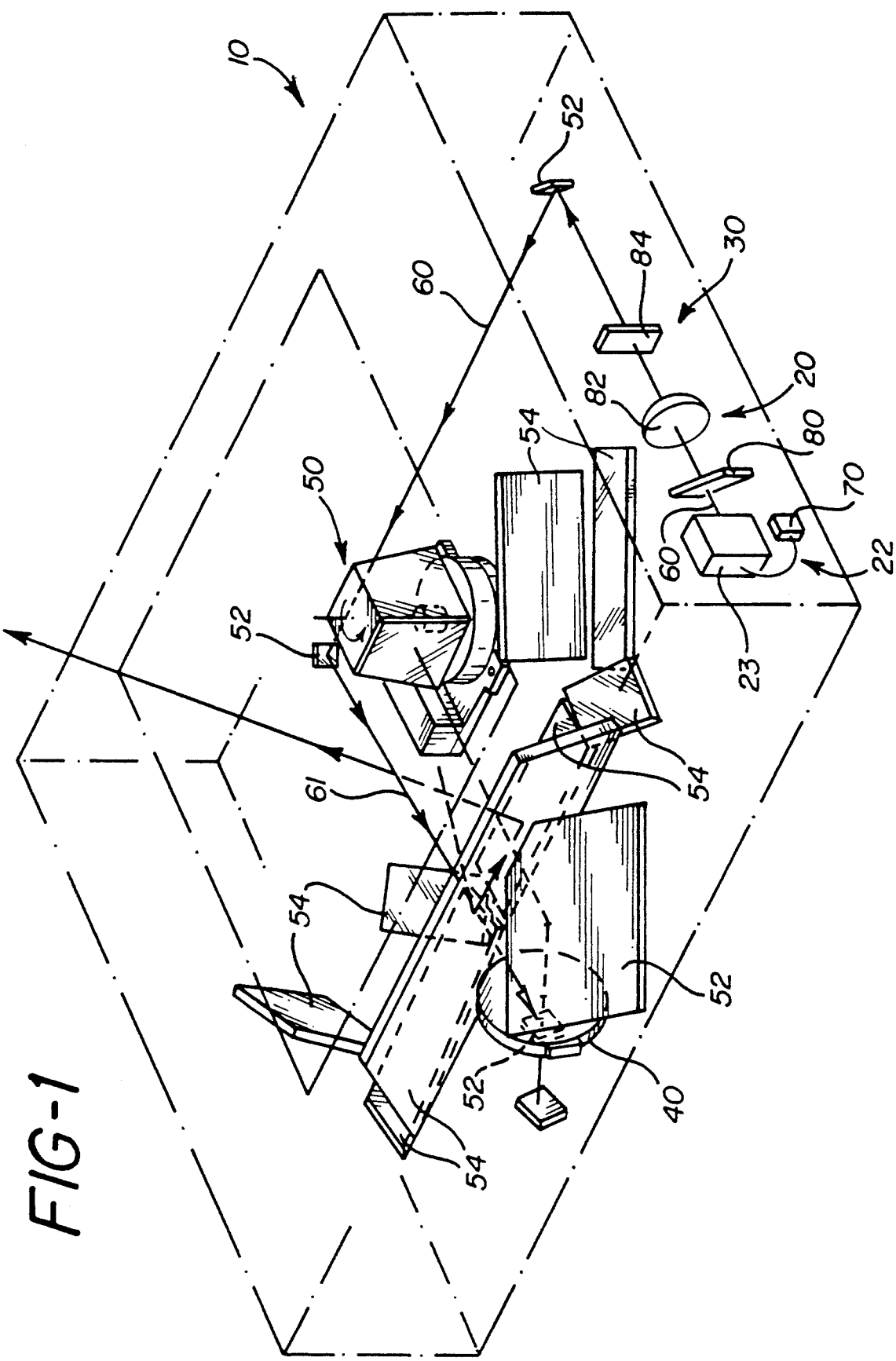
FIG. 1 is a perspective view of a laser scanner employing a laser source arrangement having optics means according to a first embodiment of the present invention.

FIG. 1 is a perspective view of a laser scanner system 10 including the laser source arrangement 20 of the present invention. The laser scanner in which the laser source arrangement 20 is employed may comprise any known scanner used to scan and then detect light reflected from a target, such as a product bearing a universal product code symbol, which is spaced from the scanner. The scanner illustrated in FIG. 1 is shown for exemplary purposes only and includes a bifocal lens assembly 40, which is similar to the one disclosed in U.S. Pat. No. 4,786,798, the disclosure of which is incorporated herein by reference, and a beam sweeping system 50. A laser beam 60 emitted from the laser source arrangement 20 is directed along a beam path 61 defined by directing mirrors 52. The beam 60 passes through the lens assembly 40 as it travels along the path 61, and is subsequently received by the beam sweeping system 50. The laser beam 60 is then swept onto reflecting means or mirrors 54 by the beam sweeping system 50 which, in turn, project a scanning pattern for reading a target (not shown). Except for the laser source arrangement 20, the laser scanner of FIG. 1 is substantially similar to the laser scanner disclosed in U.S. Pat.

No. 4,861,973, which is incorporated herein by reference.

The laser source arrangement 20 comprises a laser diode assembly 22 having a laser diode 23, which emits the laser beam 60. The laser diode 23 may comprise a gain-guided laser diode or an index-guided laser diode. As will be discussed in greater detail below, the diode assembly 22 also includes a drive means 70 for driving the diode 23 in a pulsed mode.

Figure 2:
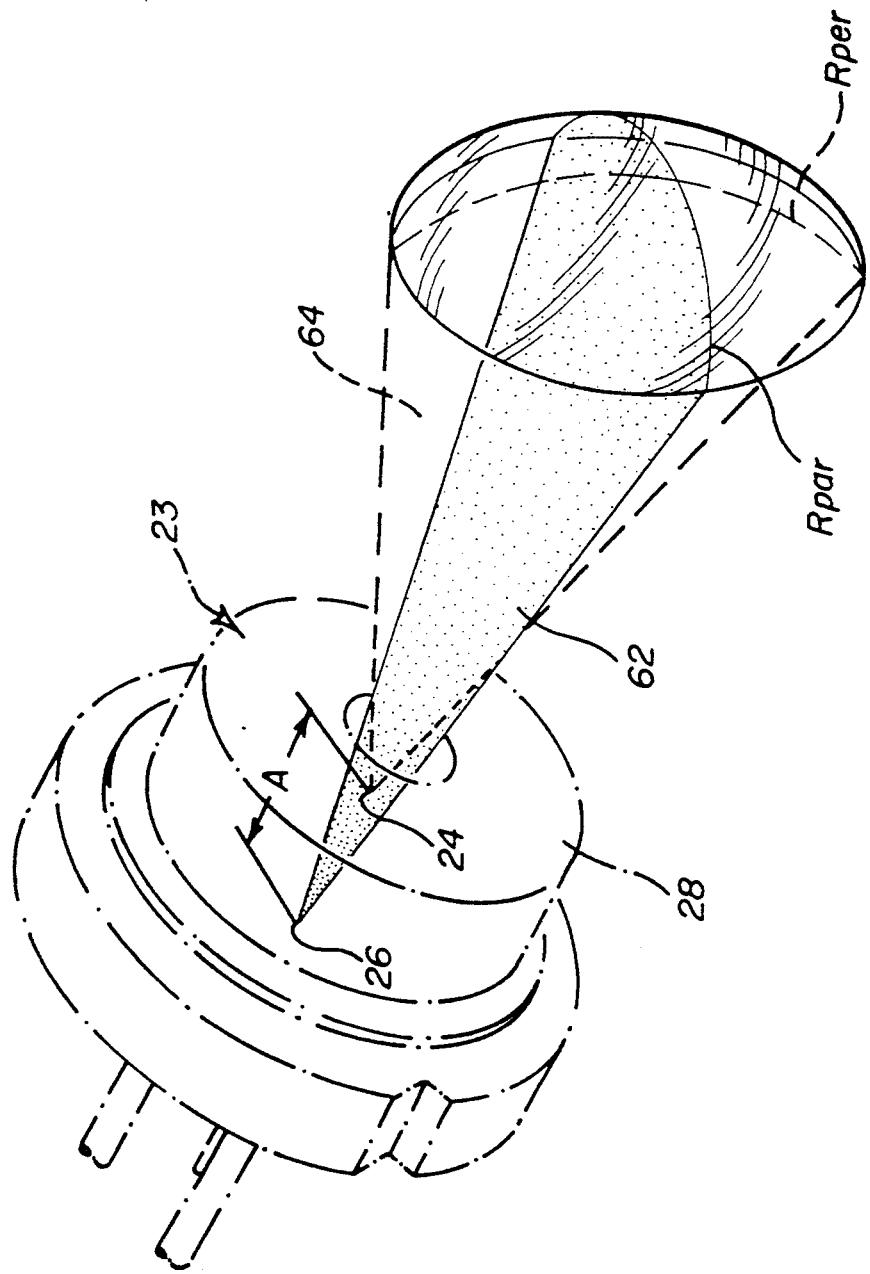
FIG. 2 is an enlarged perspective view of the laser diode of FIG. 1 illustrating the associated astigmatism.

The beam 60, as best shown in FIG. 2, is initially elliptical in shape, having a parallel divergence 62 located in a horizontal plane as illustrated and a perpendicular divergence 64 located in a vertical plane as illustrated. The horizontal plane is parallel to the facet stripe (not shown) of the laser diode 23 while the vertical plane is perpendicular to the facet stripe. The laser diode 23 is characterized by astigmatism, as a result of the radius of curvature $R_{par}$ of the parallel divergence 62 being different from the radius of curvature $R_{per}$ of the perpendicular divergence 64. Consequently, collimating or conditioning optics receive or "see", in effect, two different apparent sources, a source 24 emitting the perpendicular divergence 64 and a source 26 emitting the parallel divergence 62. The astigmatism A is defined by the distance between the apparent sources 24 and 26.

If the laser diode 23 is driven by, for example, a continuous wave input, the astigmatism A associated with the diode 23 will change as the temperature of the outer case 28 of the diode 23 changes. Thus, a static correction for astigmatism at one temperature will not correctly compensate for astigmatism over a range of case temperatures.

In accordance with the present invention, in order to reduce the amount of astigmatism A associated with the laser diode 23 and control and/or eliminate temperature dependent astigmatism changes, the diode 23 is driven in a pulsed mode. The drive means 70, as noted above, is provided for driving the diode 23 in a pulsed mode.

Figure 3:
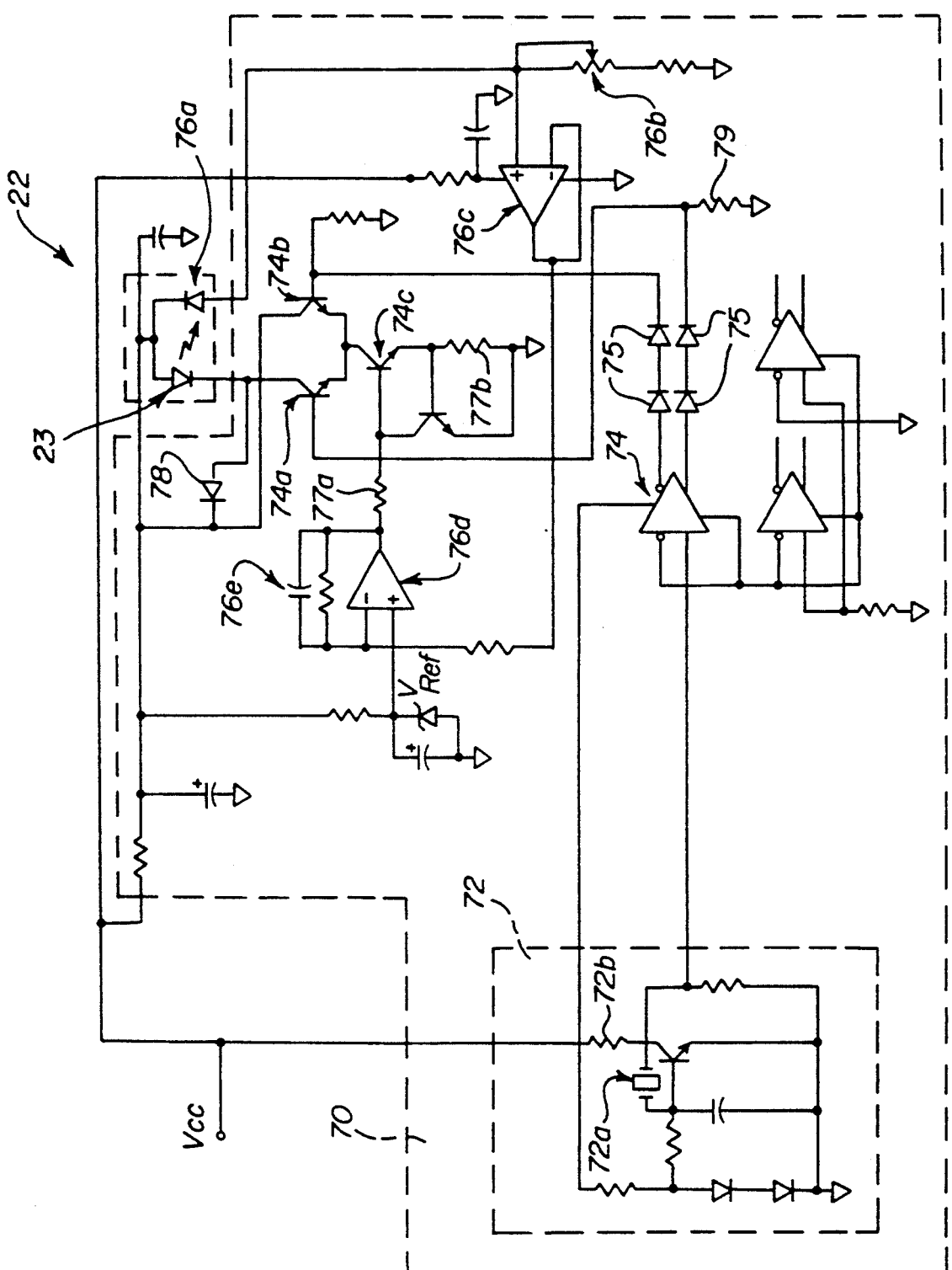
FIG. 3 is a circuit diagram illustrating drive means for driving the laser diode of FIG. 1.
Figure 5A:
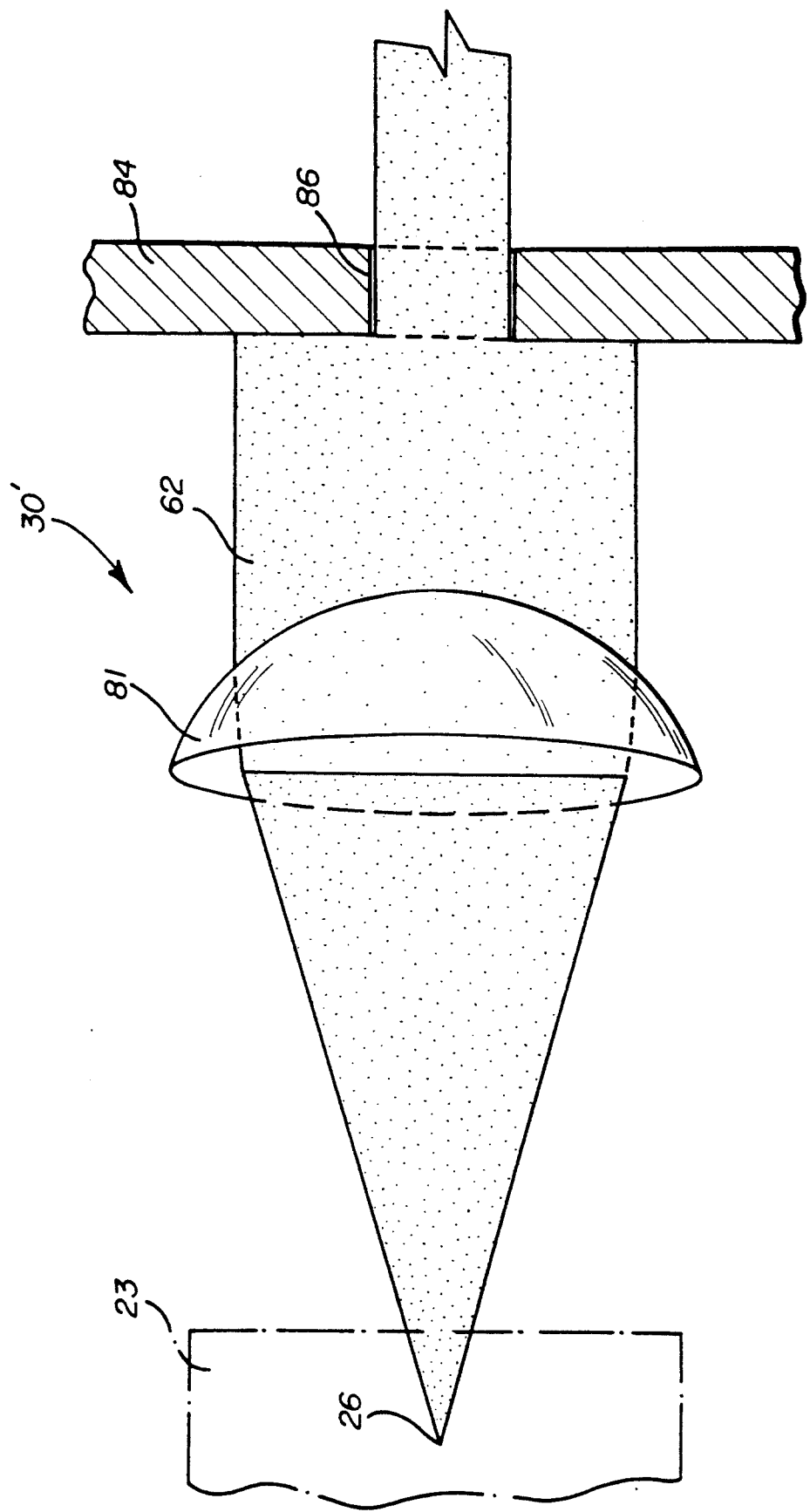
FIG. 5a is a top plan view of a laser source arrangement including optics means according to a second embodiment of the present invention and showing only the parallel divergence of the beam, i.e., only a single horizontal plane of the beam.
Figure 6B:
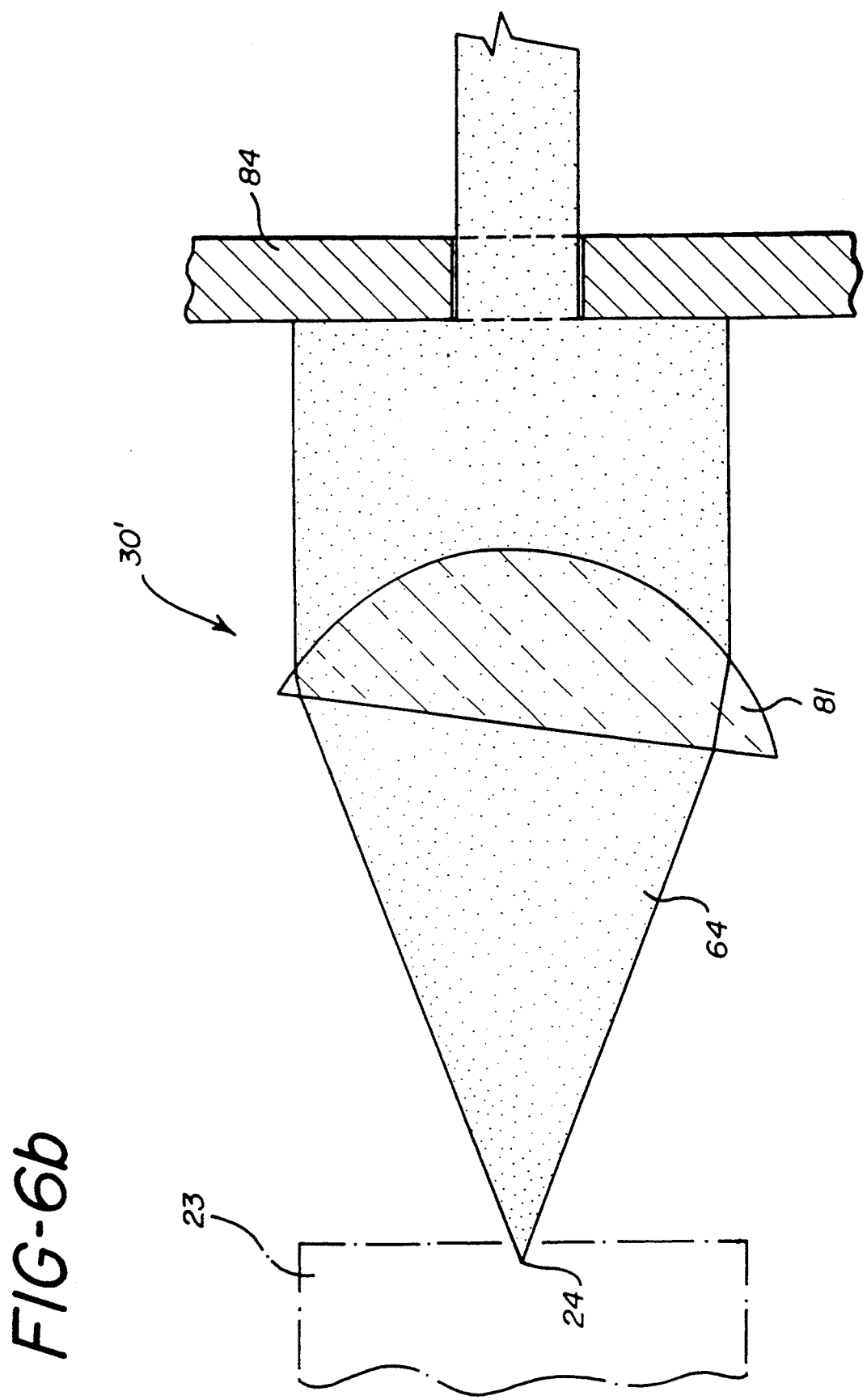
FIG. 6b shows the laser source arrangement illustrated in FIG. 5b with the tilted lens shown in section.

The drive means 70 is preferably constructed and connected to the laser diode 23 as shown in FIG. 3. The drive means 70 includes an internal oscillator 72 which sets the frequency and the duty cycle of the current which drives the laser diode 23. The oscillator 72 resonates at a frequency determined by a crystal 72a and includes a resistor 72b, the resistance of which determines the duty cycle of the oscillations.

The oscillator 72 is connected to an external emitter-coupled-logic (ECL) differential line receiver 74, which receives and buffers the signal generated by the oscillator 72 to minimize oscillator loading. The line receiver 74 further provides a drive current for a differential pair of transistors 74a and 74b, the operation of which will be discussed in detail below. Diodes 75 level shift the signal from the line receiver 74 to allow sufficient voltage headroom to ensure that the laser diode 23 will be turned on fully.

Output current switching is performed by transistors 74a and 74b. When transistor 74a is on, transistor 74b is off, and transistor 74c sinks current through transistor 74a and the laser diode 23. When transistor 74b is on, transistor 74a is off, and transistor 74c sinks current directly from the positive supply through transistor 74b.

A control loop is provided to set the current to the laser diode 23 to a value that provides the desired average optical output power from the diode 23. The control loop includes a photodiode 76a, which passes a current proportional to the optical output power of the laser diode 23. The photodiode current is converted to a voltage by a power adjustment potentiometer 76b and buffered by an amplifier 76c. The output from the amplifier 76c is compared to a reference voltage $V_{ref}$ by an amplifier 76d. The difference voltage is integrated by the amplifier 76d and a capacitor 76e. The integrated output from the amplifier 76d settles at whatever voltage is required to cause the photodiode 76a anode voltage to match the reference voltage $V_{ref}$. The transistor 74c, a resistor 77a and a resistor 77b convert the integrated voltage from the amplifier 76d to a proportional current for the transistors 74a and 74b.

A diode 78 is included to provide electrostatic discharge protection for the laser diode 23. The diode 78 provides a path for reverse discharge currents. Forward bias electrostatic discharge is dissipated through the path provided by the collector-base junction of the transistor 74a and a resistor 79.

It is further contemplated that an additional current source (not shown) may be added at transistor 74a in order to apply a bias current just below the threshold current while the laser diode 23 is off in order to reduce optical power overshoot.

The drive means 70 preferably drives the diode 23 with a controlled current input having a duty cycle, for example, of less than 50%. In order to maintain a substantially constant average optical output power level, the peak current must be increased slightly when the diode 23 is driven in a pulsed mode rather than in a continuous mode. As will be illustrated in the examples set forth below, by driving a laser diode 23 in a pulsed mode having a duty cycle of less than 50%, the astigmatism associated with the diode is reduced and the temperature dependent astigmatism changes are controlled and/or eliminated. As a result, a static correction for astigmatism can be made at one temperature in order to correctly compensate for astigmatism over a range of diode case temperatures.

As noted previously, it is known that astigmatism changes with the case temperature of the diode 23 when the diode 23 is driven in a continuous wave mode. Changes in the case temperature of the diode 23 are believed to result from changes in the ambient air temperature surrounding the diode 23 and/or from changes in the diode junction temperature. It is further believed that by driving the diode 23 in a pulsed mode, the diode 23 operates over a less extreme junction temperature range where astigmatism variation is much less, thereby reducing astigmatism variation of the diode 23, even as its case temperature increases. Because the diode 23 operates over a less extreme junction temperature range while being driven in a pulsed mode, junction temperature is believed to have a smaller influence on the diode case temperature when the diode 23 is operated in a pulsed mode rather than in a continuous mode.

The power out vs. current curve (not shown) for a typical laser diode is very steep. Consequently, only a small increase in peak current is necessary to maintain constant average optical power when the diode 23 is driven in a pulsed mode rather than in a continuous mode. It is also believed that resistive heating of the diode 23, which influences the junction temperature of the diode 23, is reduced by a factor proportional to the duty cycle of the pulsed mode. Consequently, by operating the diode 23 in a pulsed mode, the diode 23 is allowed to operate over a less extreme junction temperature range where astigmatism variation is much less, thereby causing a reduction in astigmatism variation of the diode 23, even as its case temperature increases.

The laser source arrangement 20 further includes optics means for correcting the astigmatism associated with the laser diode 23 and for conditioning the beam 60 so that the beam 60 may be employed by the laser scanner to produce the scanning pattern. A first embodiment of the optics means, designated by the reference numeral 30, is shown in FIGS. 1 and 4.

The optics means 30 includes a tilt plate 80, which is preferably made from glass or a clear polymeric material. As shown in FIG. 4, the tilt plate 80 is rotated about an axis 80a to refract the parallel divergence 62 of the beam 60 as it passes therethrough. This, in effect, moves the source 26 to a corrected source position 27, which collimating or conditioning optics see, thereby substantially eliminating the astigmatism A associated with the diode 23. As a result, the tilt plate 80 serves to substantially statically correct the astigmatism A of the beam 60 at one temperature. Additionally, since the diode 23 is driven in a pulsed mode, as discussed above, the static correction of the astigmatism A at one temperature also serves to correctly compensate for astigmatism over a range of diode case temperatures.

Since different laser diodes may have different amounts of associated astigmatism A, the tilt plate 80 may be mounted on rotational means (not shown) which permits the angle of inclination of the plate 80 to be varied in order to compensate for varying astigmatisms. While the tilt plate 80 has been described as a means for correcting the astigmatism, a cylindrical lens, or like element, may alternatively be employed in place of the tilt plate 80 for astigmatism correction.

As shown in FIG. 4, the optics means 30 also includes conditioning means, such as a plano-convex lens 82, which is positioned downstream from the tilt plate 80. The lens 82 is used to collimate the beam 60, as shown in FIG. 4. Alternatively, the lens 82 may be moved in a direction away from the diode 23 to create a focused beam which converges toward a target (not shown) to be read by the scanner 10.

The beam 60, after passing through the lens 82 of optics means 30, passes through beam cross-section control means, such as an apertured plate 84, which is positioned downstream from the lens 82. The plate 84 includes a circular aperture 86 which serves to anamorphically improve the beam 60. The shape of the aperture 86 may be changed and could alternatively be elliptical, parabolic, square, rectangular or the like. Use of an apertured plate as a beam cross-section control means is know in the prior art (see, e.g., Buzawa, *Lens System for Laser Scanners*, Laser Focus, at pg. 82 (September 1980)).

A second embodiment of the optics means, designated by reference numeral 30', is shown in FIGS. 5a, 5b, 6a, 6b, 7a and 7b. In this embodiment, the optics means 30' comprises a tilted plano-convex lens 81 which acts to induce astigmatism in the beam 60 which is equal in magnitude but opposite in sign to the astigmatism associated with the laser diode 23. This results in a beam 60 that is substantially collimated in both its parallel and perpendicular divergences 62 and 64, respectively.

The tilted lens 81, as shown in FIGS. 5b, 6b, 7a, and 7b, acts to refract the perpendicular divergence 64 of the beam 60, so as to collimate the same. The lens 81 collimates the perpendicular divergence 64 of the beam 60 because it is tilted at an angle Θ relative to vertical in the plane of the perpendicular divergence 64 so that its effective focal length in the plane of the perpendicular divergence 64 extends from source 24. The tilted lens 81 also acts to collimate the parallel divergence 62 of the beam 60, as shown in FIGS. 5a and 6a. This results because the tilted lens 81 is positioned so that its effective focal length in the plane of the parallel divergence 62 extends from the source 26. As should be apparent, the lens→ effective focal length in the plane of the perpendicular divergence 64 is different from the one in the plane of the parallel divergence 62. Since the lens 81 acts to collimate both the parallel and perpendicular divergences 62 and 64, it substantially corrects the astigmatism A associated with the emitted beam 60.

While not shown in the drawings, other known singlet lens designs or multiple element lens designs, such as a double-convex lens in contact with a concave-planar lens, may be used in place of the tilted plano-convex lens 81. Further, the particular angle at which the lens 81 is tilted for astigmatism correction may be evaluated by well-known optical analysis software to ensure that it is correct. It should also be apparent that, if desired, the tilted lens 81 may be employed to only partially correct astigmatism associated with the laser diode 23.

Figure 7A:
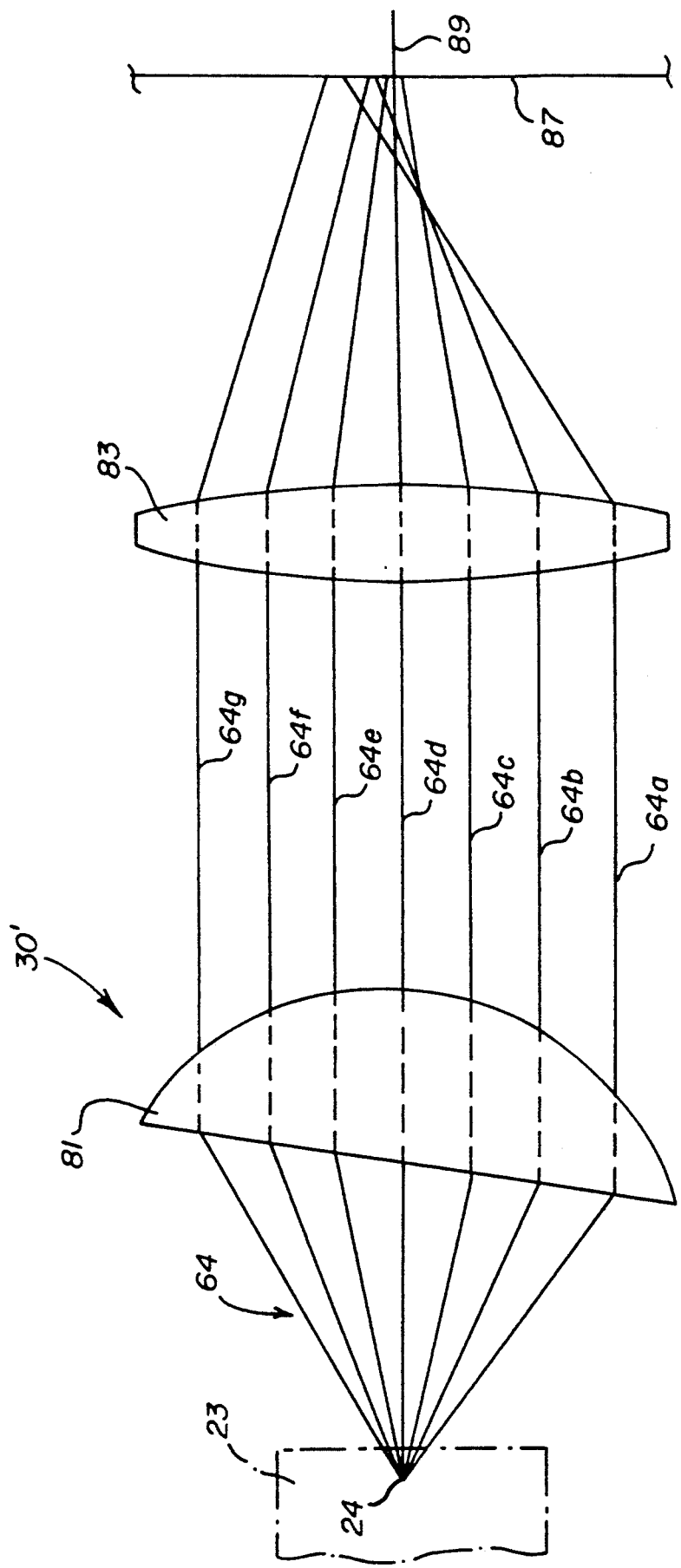
FIG. 7a shows the laser source arrangement of FIG. 5b, without an apertured plate, in combination with an image lens and illustrating coma induced into the beam by the tilted lens.

The tilted lens 81, while acting to substantially reduce astigmatism A, also induces coma into the beam 60. In FIG. 7a, rays 64a–64g of the perpendicular divergence 64 are shown passing through tilted lens 81 and an image lens 83 (the image lens 83 is functionally equivalent to the center portion of the bifocal lens assembly 40) before striking a planar surface 87. As a result of coma being induced into the beam 60 as it passes through the tilted lens 81, rays 64a, 64b, 64f and 64g are not coaxial with central axis 89 and are focussed at a different height than rays 64c–64e, see FIG. 7a.

Figure 7B:
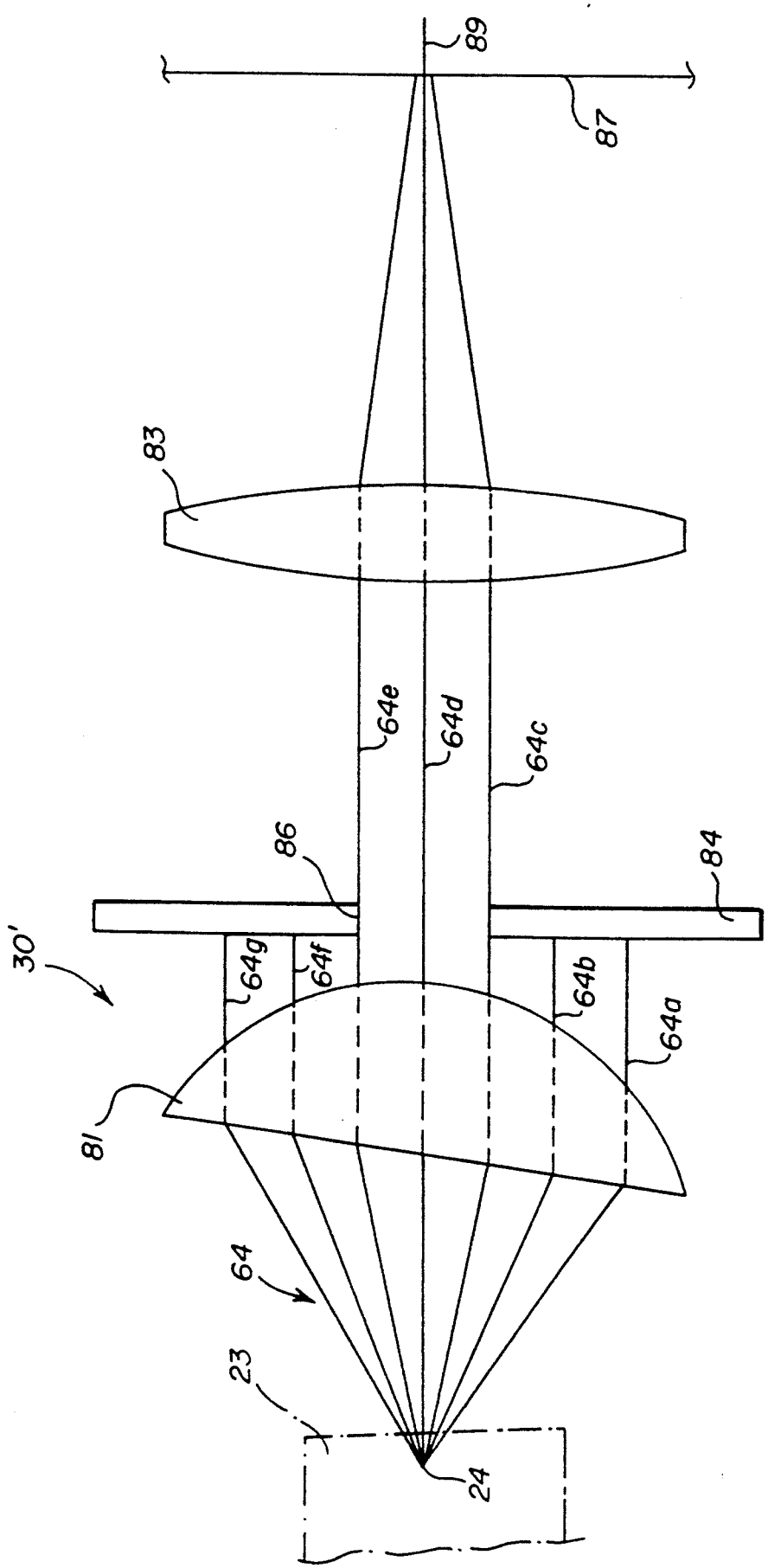
FIG. 7b shows the laser source arrangement of FIG. 5b in combination with an image lens and illustrating correction of the induced coma by the apertured plate.

In order to correct or reduce the coma associated with the beam 60, an apertured plate 84 is positioned downstream from the lens 81, see FIG. 7b. The plate 84 includes a circular aperture 86 which serves to block portions of the laser beam corresponding to rays 64a, 64b, 64f and 64g in FIG. 7b from passing therethrough, thereby substantially eliminating the coma induced into the beam by the tilted lens 81. The shape of the aperture 86 may be changed and could alternatively be elliptical, parabolic, square, rectangular or the like.

The following examples are given to illustrate certain preferred details of the present invention, it being understood that the details of the examples are not to be taken as in any way limiting the invention thereto.

EXAMPLE 1

A Sony TM gain-guided laser diode (680 nm, aspect ratio = 3:1) was tested for temperature dependent astigmatism changes during four separate tests.

Figure 8:
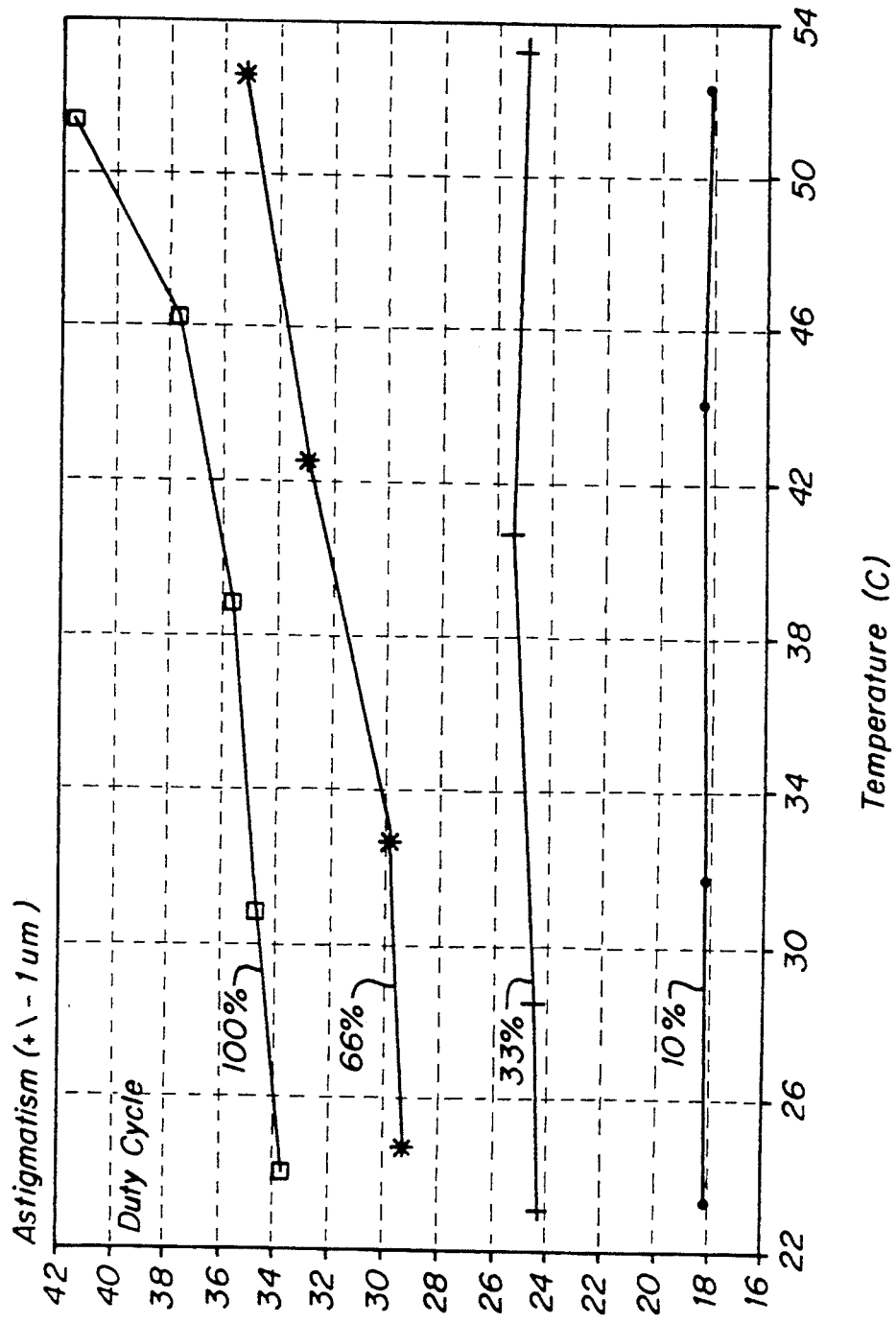
FIG. 8 is an astigmatism vs. temperature graph, illustrating first test results for the laser diode employed in Example 1.

During test #1, the diode was driven at a peak power of 3 milliwatts by a 1 MHZ current at duty cycles of 100%, 66%, 33%, and 10%. At each duty cycle, the astigmatism of the diode was measured as the case temperature of the diode increased. The results from the first test are shown in FIG. 8. As shown therein, it can be seen that at the 100% duty cycle, the astigmatism of the diode increased continuously as the case temperature of the diode increased. The astigmatism also increased with temperature during the 66% duty cycle, but at a lesser rate. However, during the 33% duty cycle, the astigmatism increased only slightly with temperature, and during the 10% duty cycle, the astigmatism remained substantially unchanged. Further, the amount of astigmatism was lowest during the 10% duty cycle.

Figure 9:
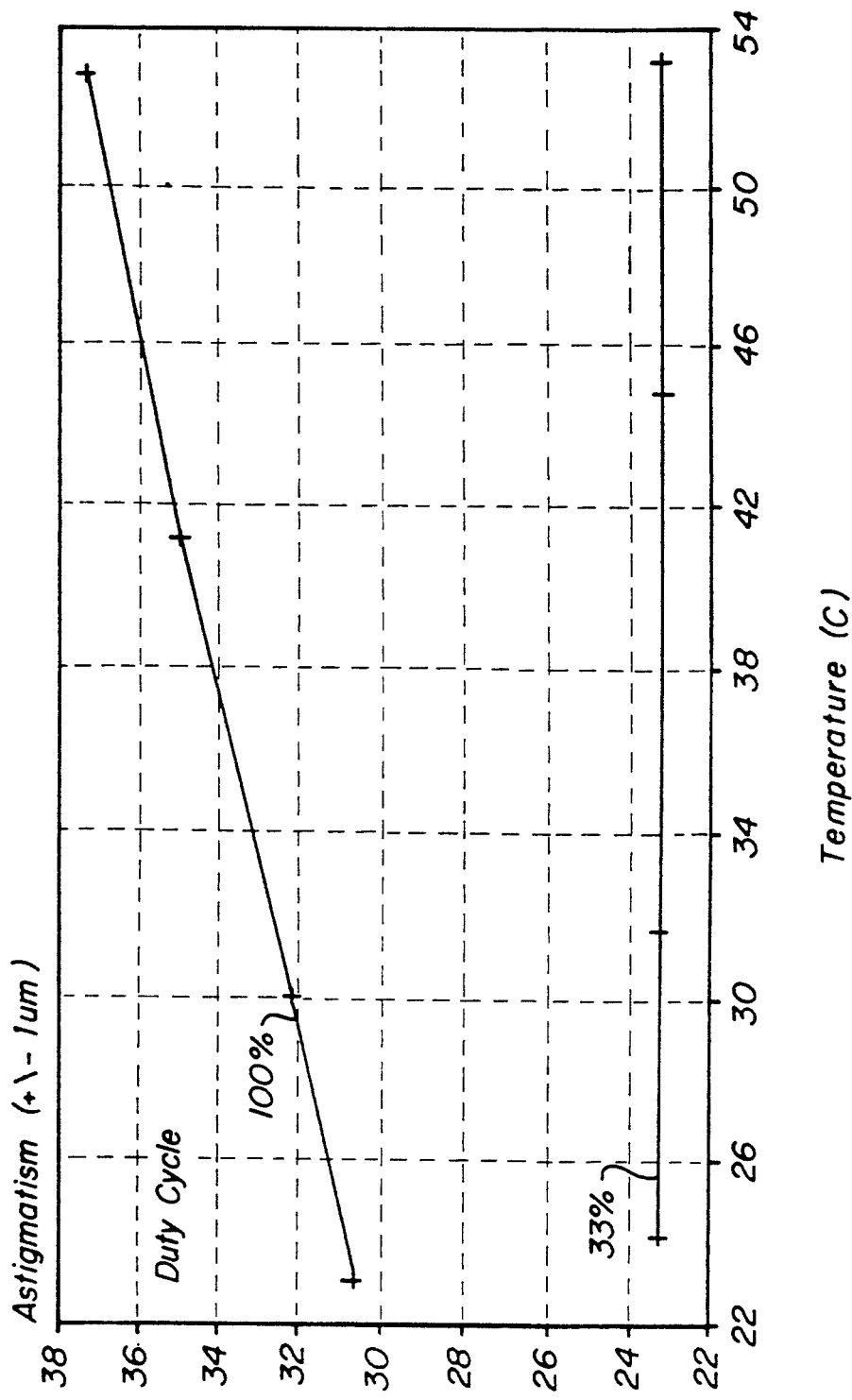
FIG. 9 is an astigmatism vs. temperature graph, illustrating second test results for the laser diode employed in Example 1.

During test #2, the same diode was driven at a peak power of 3 milliwatts by a 11.08 MHZ current input at duty cycles of 100% and 33%. The average power was 3 mW during the 100% duty cycle and was 0.845 mW during the 33% duty cycle (the electrical and optical duty cycles are different). The diode was tested for temperature dependent astigmatism changes and the results are shown in FIG. 9. As shown, during the 100% duty cycle, the astigmatism increased as the case temperature of the diode increased. However, during the 33% duty cycle, the astigmatism remained substantially unchanged as the case temperature increased. Further, the amount of astigmatism during the 33% duty cycle was lower than during the 100% duty cycle.

Figure 10:
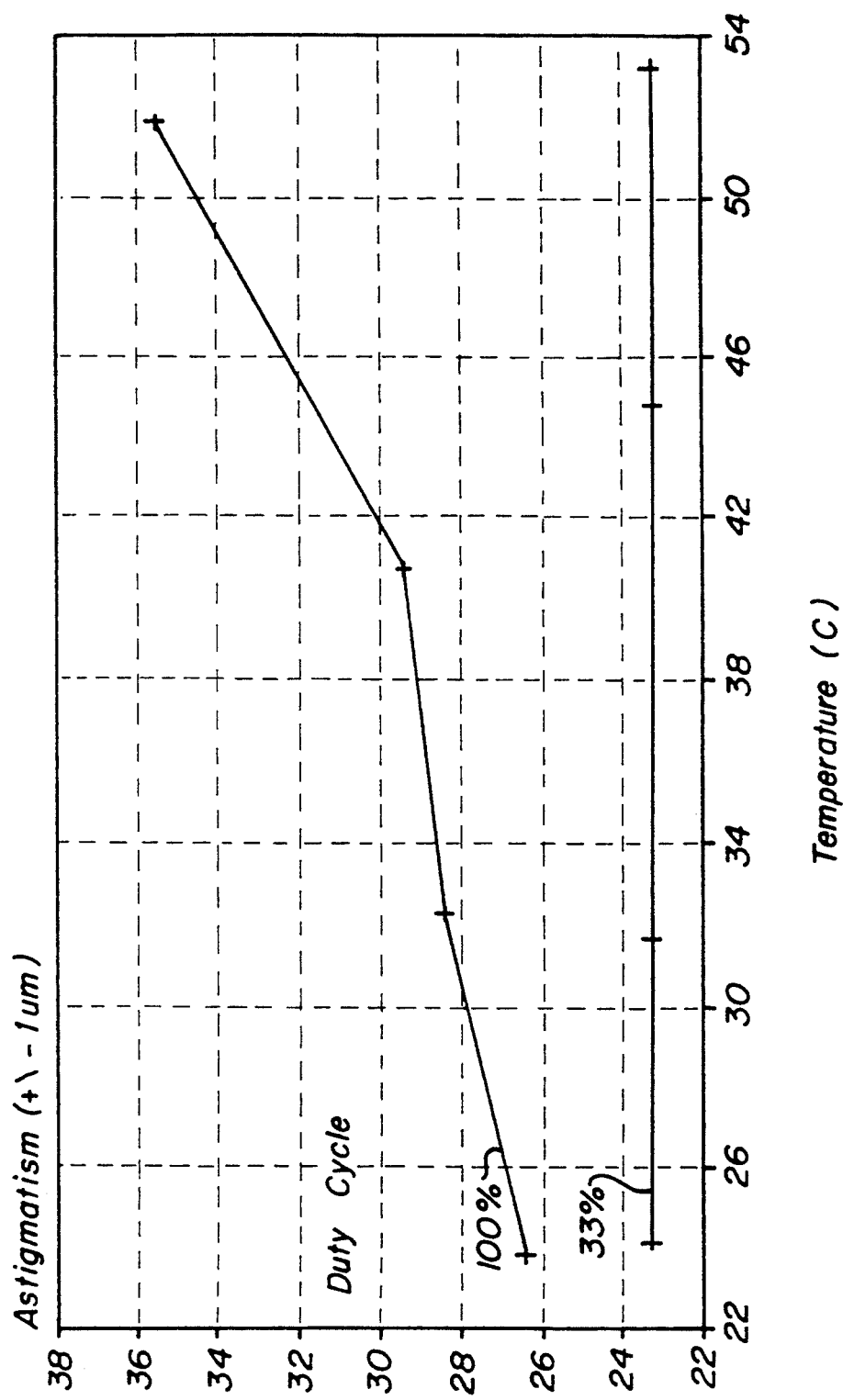
FIG. 10 is an astigmatism vs. temperature graph illustrating third test results for the laser diode employed in Example 1.

During test #3, the same diode was driven at an average power of 0.845 mW by a 11.08 MHZ current input at duty cycles of 100% and 33%. The peak power was 0.845 mW during the 100% duty cycle and was 3 mW during the 33% duty cycle. The diode was tested for temperature dependent astigmatism changes at each duty cycle, and the results are shown in FIG. 10. Again, astigmatism increased with temperature during the 100% duty cycle, and remained substantially unchanged during the 33% duty cycle. Further, the amount of astigmatism was lowest during the 33% duty cycle.

Figure 11:
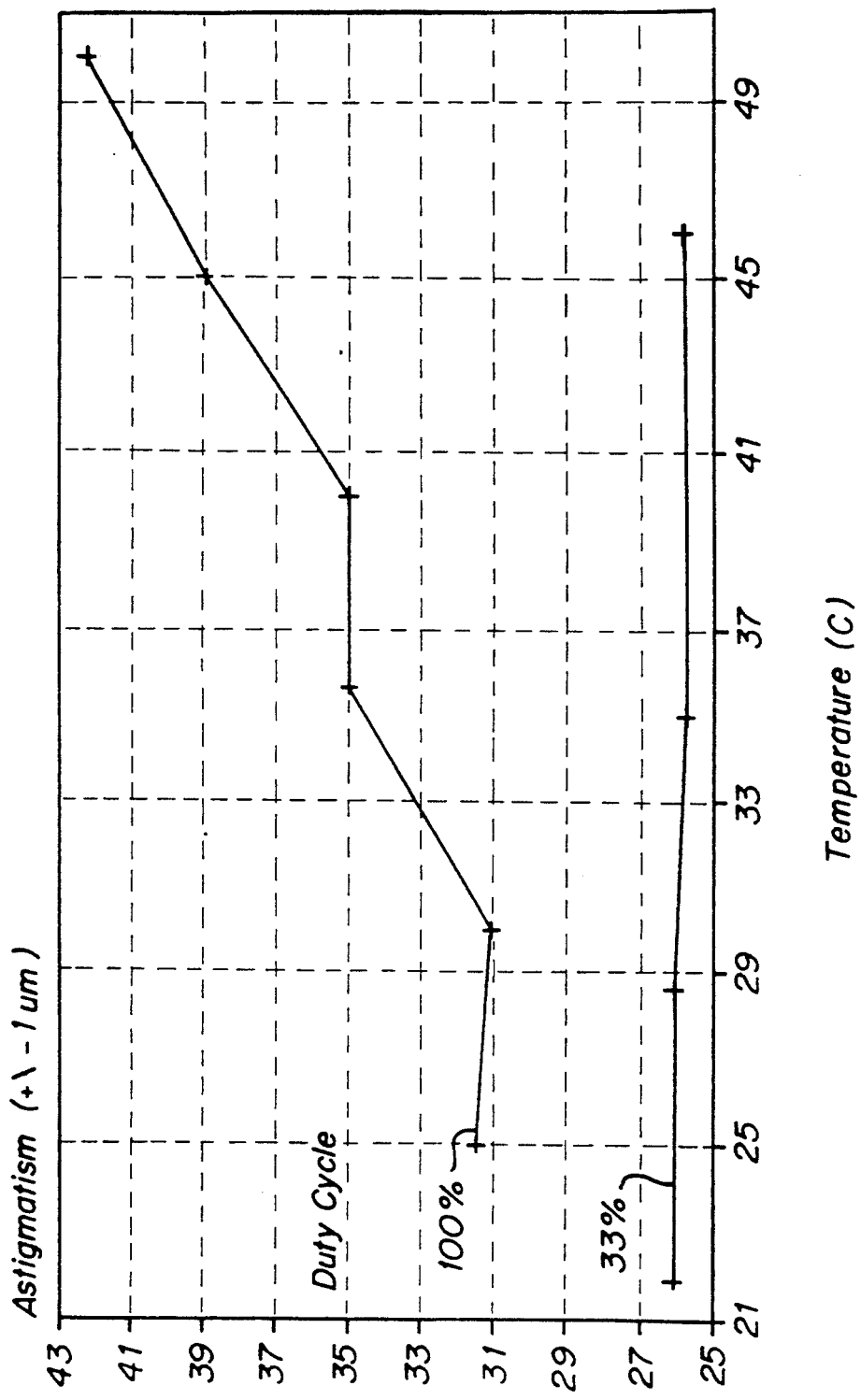
FIG. 11 is an astigmatism vs. temperature graph, illustrating fourth test results for the laser diode employed in Example 1.

During test #4, the same diode was driven at an average power of 1 mW by a 11 MHZ current input at duty cycles of 100% and 33%. The peak power was 1 mW during the 100% duty cycle and was 3 mW during the 33% duty cycle. As shown in FIG. 11, astigmatism again increased with temperature during the 100% duty cycle, and remained substantially constant during the 33% duty cycle. Further, the amount of astigmatism during the 33% duty cycle was lower than during the 100% duty cycle.

EXAMPLE 2

A Toshiba TM gain-guided laser diode (670 nm, aspect ratio=5:1) was tested for temperature dependent astigmatism changes at various duty cycles. The diode was driven at a peak power of 3 mW by a 11.08 MHZ current at duty cycles of 100% and 33%. The diode was tested at each duty cycle for astigmatism changes, and the results are shown in FIG. 12. As shown therein, astigmatism increased as the case temperature of the diode increased during the 100% duty cycle. During the 33% duty cycle, however, astigmatism remained substantially unchanged as the case temperature increased. Further, the amount of astigmatism was lowest during the 33% duty cycle.

The results of Examples 1 and 2 above lead to the following conclusions:

1) The astigmatism associated with the laser diodes changed as the case temperature of the diodes changed when the diodes were driven by a substantially constant current to produce a substantially constant optical power level. More specifically, the astigmatism associated with the laser diodes increased as the case temperature of the diodes increased when the diodes were driven by a current input at a duty cycle of 100% and were held at constant optical power. Additionally, for the diode employed in Example 1, when it was driven by a current at a 66% duty cycle, astigmatism again increased, but at a lesser rate than it did during the 100% duty cycle.

2) The astigmatism associated with the laser diodes remained substantially unchanged or only increased slightly as the case temperature of the diodes increased when the diodes were driven by a current input at a duty cycle of 33%. Additionally, for the diode employed in Example 1, the astigmatism remained substantially unchanged when it was driven by a current at a 10% duty cycle.

3) As the duty cycle of the current decreased, the amount of astigmatism associated with each laser diode also decreased.

With the present invention, a method and apparatus are provided for reducing the amount of the astigmatism in a laser diode, and for controlling and/or eliminating the temperature dependence of the astigmatism of a laser diode. This is achieved by driving the diode in a pulsed mode at a duty cycle, preferably, of less than 50%.

It is additionally contemplated by the present invention, that the optics means 30, as shown in FIG. 4, or the optics means 30', as shown in FIGS. 5a, 5b, 6a, 6b, 7a and 7b, may be employed with a laser beam source, such as a He-Ne gas laser tube (not shown), which has little or no astigmatism associated therewith, to induce astigmatism in the beam emitted by that source.

Having described the invention in detail and by reference to preferred embodiments thereof, it will be apparent that modifications and variations are possible without departing from the scope of the invention defined in the appended claims.

What is claimed is:

1. A laser source assembly for use in a laser instrument of a kind used to direct laser light to a target which is spaced from the laser instrument, said laser source assembly comprising:
   light source means for producing a laser beam, said light source means being characterized by astigmatism; and
   means for driving said light source means in a pulsed mode having a duty cycle which reduces and controls said astigmatism.

2. A laser source assembly as set forth in claim 1, wherein said means for driving said light source means is operated at a duty cycle of less than 50%.

3. A laser source assembly as set forth in claim 1, wherein said means for driving said light source means is operated at a duty cycle of less than 35%.

4. A laser source assembly as set forth in claim 1, wherein said light source means comprises a gain-guided laser diode.

5. A laser source assembly as set forth in claim 1, wherein said light source means comprises an index-guided laser diode.

6. A laser source assembly as set forth in claim 1, wherein said laser instrument includes means for detecting laser light reflected from said target.

7. A laser source arrangement for use in a laser instrument of a kind used to transmit a scan pattern to a target which is spaced from the laser instrument, said laser source arrangement comprising:
   light source means for producing a laser beam, said light source means being characterized by astigmatism;
   means for driving said light source means in a pulsed mode having a duty cycle which reduces and controls said astigmatism; and
   optics means for correcting said astigmatism and for conditioning said beam so that said beam may be employed by said laser instrument to produce said scan pattern.

8. A laser source arrangement as set forth in claim 7, wherein said means for driving said light source means is operated at a duty cycle of less than 50%.

9. A laser source arrangement as set forth in claim 7, wherein said means for driving said light source means is operated at a duty cycle of less than 35%.

10. A laser source arrangement as set forth in claim 7, wherein said light source means comprises a gain-guided laser diode.

11. A laser source arrangement as set forth in claim 7, wherein said light source means comprises an index-guided laser diode.

12. A laser source arrangement as set forth in claim 7, wherein said optics means comprises a tilted lens for statically correcting said astigmatism and for conditioning said beam so that said beam may be employed by said laser instrument to produce said scan pattern.

13. A laser source arrangement as set forth in claim 7, wherein said optics means comprises a tilt plate positioned adjacent to said light source means for correcting said astigmatism and a collimating lens for conditioning said beam so that said beam may be employed by said laser instrument to produce said scan pattern.

14. A laser source arrangement as set forth in claim 7, wherein said optics means comprises a cylindrical lens positioned adjacent to said light source means for correcting said astigmatism and a collimating lens for conditioning said beam so that said beam may be employed by said laser instrument to produce said scan pattern.

15. A laser source arrangement as set forth in claim 7, further comprising means for controlling the cross-sectional shape of said beam.

16. A laser source arrangement as set forth in claim 15, wherein said controlling means comprises an apertured plate.

17. A laser source arrangement as set forth in claim 7, wherein said optics means induces coma into said beam and said laser source arrangement further comprises means for correcting said coma.

18. A laser source arrangement as set forth in claim 17, wherein said means for correcting said coma comprises an apertured plate.

19. A laser source arrangement as set forth in claim 7, wherein said laser instrument includes means for detecting light reflected from the target.

20. A method for reducing and controlling astigmatism associated with light source means for producing a laser beam for use in a laser instrument of a kind used to direct laser light to a target which is spaced from the laser instrument, said method comprising the step of:
driving said light source means in a pulsed mode having a duty cycle which reduces and controls said astigmatism associated with said light source means.

21. A method as set forth in claim 20, wherein said step of driving said light source means includes the step of driving said light source means at a duty cycle of less than 50%.

22. A laser source arrangement for use in a laser instrument of a kind used to transmit a scan pattern to a target which is spaced from the laser instrument, said laser source arrangement comprising:
light source means for producing a laser beam, said light source means being characterized by astigmatism; and
tilted lens means for correcting said astigmatism and for conditioning said beam so that said beam may be employed by said laser instrument to produce said scan pattern.

23. A laser source arrangement as set forth in claim 22, wherein said tilted lens means comprises a tilted plano-convex lens for statically correcting said astigmatism and for conditioning said beam so that said beam may be employed by said laser instrument to produce said scan pattern.

24. A laser source arrangement as set forth in claim 23, wherein said means for correcting said coma comprises an apertured plate.

25. A laser source arrangement as set forth in claim 22, wherein said tilted lens means comprises a multi-element lens.

26. A laser source arrangement as set forth in claim 22, wherein said tilted lens means induces coma into said beam and said laser source arrangement further comprises means for correcting said coma.

27. A laser source arrangement as set forth in claim 22, wherein said laser instrument includes means for detecting light reflected from the target.

28. A laser source arrangement for use in a laser instrument of a kind used to transmit a scan pattern to a target which is spaced from the laser instrument, said laser source arrangement comprising:
means for producing a laser beam; and
tilted lens means for inducing astigmatism in said laser beam.

29. A laser source arrangement as set forth in claim 28, wherein said tilted lens means comprises a tilted plano-convex lens.

30. A laser source arrangement as set forth in claim 28, wherein said tilted lens means comprises a multi-element lens.

31. A laser source arrangement as set forth in claim 28, wherein said laser beam producing means comprises a gas laser tube.

32. A laser source arrangement as set forth in claim 28, wherein said laser instrument includes means for detecting light reflected from the target.

33. A laser source arrangement for use in a laser instrument of a kind used to transmit a scan pattern to a target which is spaced from the laser instrument, said laser source arrangement comprising:
light source means for producing a laser beam;
optics means for conditioning said beam to allow said beam to be employed by said laser instrument to produce said scan pattern, said optics means inducing coma into said beam; and
means for correcting said coma induced into said beam.

34. A laser source arrangement as set forth in claim 33, wherein said means for correcting said coma comprises an apertured plate.

35. A laser source arrangement as set forth in claim 33, wherein said laser instrument includes means for detecting light reflected from the target.

36. A laser source arrangement for use in a laser instrument of a kind used to transmit a scan pattern to a target which is spaced from the laser instrument, said laser source arrangement comprising:
light source means for producing a laser beam, said light source means being characterized by astigmatism;
means for driving said light source means in a pulsed mode at a given duty cycle to reduce and control said astigmatism; and
optics means for correcting said astigmatism and for conditioning said beam so that said beam may be employed by said laser instrument to produce said scan pattern.

* * * * *